Oct. 11, 1960 W. C. DERSCH 2,956,155

ELECTRONIC COUNTER

Filed Feb. 9, 1956

*INVENTOR.*
WILLIAM C. DERSCH

*BY* Paul M. Brannen

AGENT

United States Patent Office 2,956,155

Patented Oct. 11, 1960

2,956,155

ELECTRONIC COUNTER

William C. Dersch, Los Altos, Calif., assignor to International Business Machines Corporation, New York, N.Y., a corporation of New York Filed Feb. 9, 1956, Ser. No. 564,524

10 Claims. (Cl. 250—27)

Figure 1:
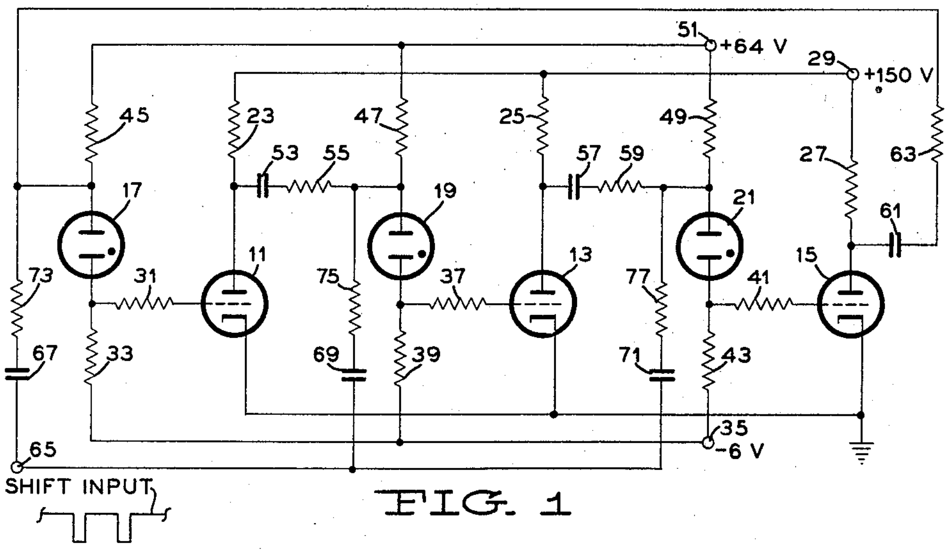

My invention relates to electronic counters and particularly to an improved electronic counter requiring only one electron discharge device and one gaseous or glow-discharge diode per stage.

It has previously been proposed to provide electronic counters employing two or more electron discharge devices per stage. Additionally, gas diodes, such as neon lamps, have previously been proposed as indicators to provide a visual indication of the conductive or non-conductive state of a particular tube or stage in an electronic counter.

An object of my invention is to provide an improved electronic counter employing but one electron discharge device per stage.

Another object of my invention is to provide an improved electronic counter employing a single electron discharge device and an associated gas diode for each stage, the gas diode serving the dual purpose of a circuit element and an indicator device.

Another object of my invention is to provide an improved electronic counter.

In practicing my invention, I provide a plurality of interconnected electron discharge devices, such as conventional triodes, and gas diodes, one of the electron discharge devices and one gas diode being provided for each stage of the counter or ring. The gas diodes are connected by suitable impedance networks to a source of electrical energy, with the parts proportioned and arranged so that a bias voltage across the diode is insufficient to strike the discharge, but is normally sufficient to maintain the diode conductive after it has been rendered conductive. The triodes are provided with suitable bias voltages so that they are normally cut off or non-conducting.

When the gas diode is rendered conductive, it causes the bias potential supplied to the associated triode to change to render the triode conductive. Thus in the "on" condition of a stage, both the triode and the gas diode of that stage are conductive.

Each of the triodes is provided with an output circuit arranged to cause the gas diode associated with the next succeeding stage to conduct when the triode in the preceding stage is cut off.

Shifting of conduction from one stage to the next is produced by supplying shift pulses of suitable polarity to each stage in such manner that the conductive gas diode is cut off as well as the associated triode.

Other objects of the invention will be pointed out in the following description and claims and illustrated in the accompanying drawing, which discloses, by way of example, the principle of this invention and the best mode which has been contemplated of applying that principle.

Figure 2:
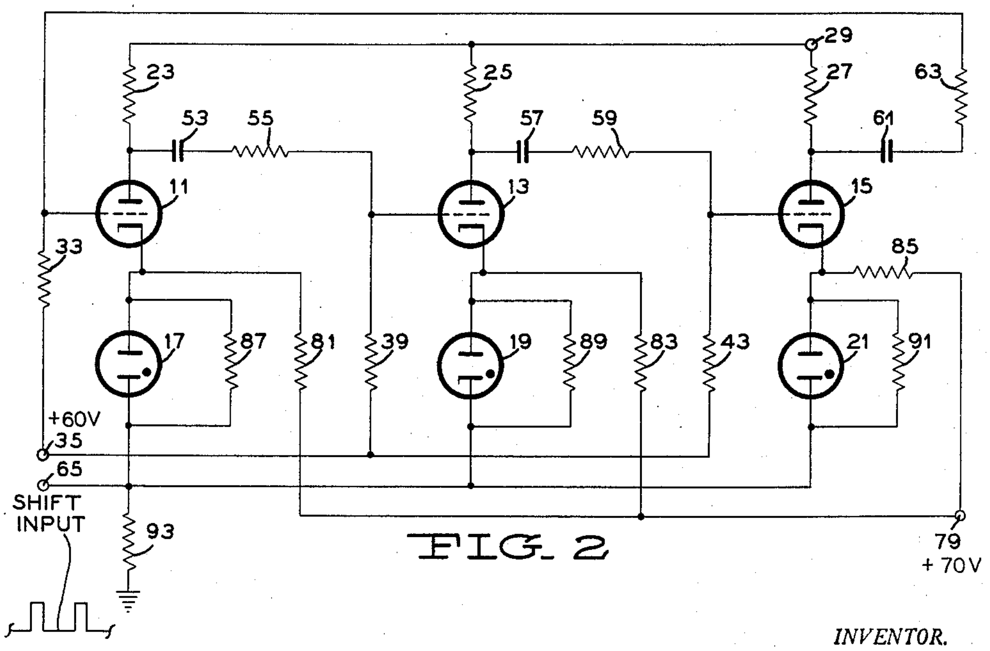

In the drawing:

Fig. 1 is a schematic diagram of an electronic counter arranged in accordance with a first preferred embodiment of my invention, and Fig. 2 is a schematic diagram of an electronic counter circuit arranged in accordance with a second preferred embodiment of my invention.

Similar reference characters refer to similar parts in each of the two views.

Referring to Fig. 1 of the drawings, there is shown a three-stage ring or re-entrant counter circuit constructed in accordance with my invention. Each of the stages is provided with an electron discharge device, here shown as a conventional triode, such as triodes 11, 13, and 15, provided for the first, second, and third stages, respectively. A gas diode, which may be, for example, a neon lamp, is provided for each stage as indicated by the diodes 17, 19, and 21. The anodes of the triodes are connected through anode resistors 23, 25, and 27, to the positive terminal 29 of a suitable anode potential, or source of direct current, not shown, the negative terminal of which is grounded. The anode potential may have a value of +150 volts, for example, as indicated on the drawing. The cathodes of the triodes are connected directly to ground, as shown. Each of the triodes has a control electrode or grid connected to one terminal of the associated gas diode and also connected to a suitable source of bias potential. Thus the grid of triode 11 is connected through the grid limiting resistor 31 to the lower element of gas diode 17, and is additionally connected through resistor 33 to the negative terminal 35 of a source of bias potential, not shown, the positive terminal of which is grounded. This triode bias potential has a value, such as −6 volts as indicated, which is normally sufficient to maintain the triodes cut off or non-conductive. Similar connections are established for triodes 13 and 15 by resistors 37, 39 and 41, 43, respectively.

The upper element of each of the gas diodes is connected through a resistor such as resistors 45, 47, and 49, to the positive terminal 51 of a suitable source of control or diode bias potential, the negative terminal of which is grounded. The value of the diode bias potential is such that the voltage impressed across the gas diodes or neon lamps is insufficient to initiate a discharge in the diode, but is sufficient to maintain a discharge in the diode after it has been rendered conductive. For example, if neon lamps having a striking or ignition voltage of approximately 80 volts and a sustaining or extinguishing voltage of approximately 60 volts are employed, then the value of the potential at terminal 51 may be of the order of +64 volts, as shown. In this case the upper element of each of the neon lamps would normally be at a potential of +64 volts, and since the lower element of each of the lamps is connected to −6 volts, it is apparent that a 70 volt potential difference normally exists between the elements of the lamps, which voltage is less than the 80 volt striking voltage but greater than the 60 volt sustaining voltage.

The anode of each of the triodes is connected through a suitable impedance coupling arrangement such as a capacitor and resistor to the upper element of the gas diode in the next succeeding stage. Capacitor 53 and resistor 55 serve as the interstage coupling between the first and second stages of the counter, and capacitor 57 and resistor 59 serve as the interstage coupling between the second and third stages of the counter. Since the arrangement shown is a ring-type counter, the output of the third stage is connected to the input of the first stage through capacitor 61 and resistor 63.

The arrangement shown in Fig. 1 is completed by the provision of means for supplying suitable voltage pulses to the input of each stage for rendering the various stages conductive and non-conductive in sequence. In this embodiment, negative-going shift pulses are supplied to each stage from a suitable source, not shown, arranged to supply such pulses to a shift input terminal 65. From this terminal, the shift pulses are supplied simultaneously to each of the stages of the counter via suitable coupling impedances, such as a capacitor and resistor in series as illustrated by capacitors 67, 69, and 71 and the associated resistors 73, 75, and 77.

In describing the operation of the embodiment of the invention shown in Fig. 1, it is believed that the description will be enhanced by first describing the conditions encountered in a single stage under various conditions, and thereafter pointing out how the arrangement operates with several stages connected as shown.

Considering the first stage, for example, as a typical stage, the parts are selected and arranged so that the triode 11 is non-conducting when the associated gas diode 17 is non-conducting, and conversely, the triode 11 is rendered conductive when the gas diode 17 is rendered conductive. As previously pointed out, the gas diodes normally have a potential difference between the elements of approximately 70 volts. Since a higher voltage, for example 80 volts, is required to initiate the discharge in the gas diode, the stage is stable in this non-conductive, or "off" condition. If the gas diode 17 is now ionized, as by raising the voltage across its elements to some value exceeding the striking voltage, i.e., 80 volts, the gas diode will conduct, and the voltage across its elements will drop to the sustaining value of 60 volts. Since only 60 volts is required to maintain the tube conductive, and with the available voltage equal to 70 volts, it will be apparent that a voltage drop will exist across the resistors 45 and 33, in series with the gas diode. The parts are proportioned and arranged so that the voltage drop across resistor 33 is sufficient, when gas diode 17 is fired, to raise the potential of the grid of tube 11 from its cutoff bias value of −6 volts with respect to the cathode, to some more positive value, e.g., 0 volts, sufficient to cause triode 11 to become conductive. This condition, with the gas diode and the associated triode conductive, may be considered the second stable state, or "on" condition of the counter stage.

If the stage is considered to be "on," and a negative-going shift pulse of suitable magnitude is supplied thereto from the shift input, the voltage across the gas diode is lowered to some value selected to fall below the extinguishing voltage of the diode, that is, some value less than 60 volts. If the shift pulse is of a duration at least as long as the de-ionizing time of the diode, the diode will be extinguished, and remain non-conductive after the shift pulse ceases. Cessation of conduction of the gas diode 17 restores the negative triode bias of −6 volts to the grid of triode 11, so that the triode conduction is cut off.

It can be seen from the foregoing that a gas diode is utilized in each counter stage as a bi-stable switching device to control the conductive condition of the associated triode. If gas diodes which produce a luminous discharge, such as neon lamps, are employed, the neon lamps will serve both as switching devices and as visual indicators to show which stage or stages of a counter are "on." It can also be seen that each stage, when turned "on" by a suitable positive-going pulse supplied to the input, will remain "on" until turned "off" by the supply of a suitable negative-going shift input pulse supplied to the input of the stage.

Considering the combination of a plurality of stages in a ring-type or re-entrant counter, as shown in Fig. 1, the anode of each of the triodes is coupled to the input of the next subsequent stage, by the impedance couplings previously described, such as capacitor 53 and resistor 55 which couple the first and second stages.

The operation of a ring such as shown in Fig. 1 will now be described, assuming that the first stage is in its "on" condition and the second and third stages are in their "off" condition.

When a shift pulse is supplied to terminal 65, it is supplied simultaneously to the inputs of all stages of the counter. At the first stage, the negative shift pulse will reduce the potential difference across the elements of gas diode 17 to a value such that ionization will cease and the diode will become non-conductive. Accordingly, the grid of triode 11 will now be biased sufficiently negative to cut off conduction. The sharp rise in the plate or anode voltage of triode 11 will supply a positive pulse to the input of the second stage. The parts are proportioned and arranged so that the value of this positive pulse will overcome the effect of the negative shift pulse also present at this time at the input of the second stage, with the net effect of ionizing the gas diode 19 of the second stage. This ionization causes the triode 13 to become conducting, as previously explained. The consequent negative-going pulse supplied to the gas diode 21 of the third stage from the second stage triode, in combination with the negative shift pulse, produces no change in the state of the third stage.

At the end of the shift pulse, the gas diode 19 will remain ionized and the associated triode 13 will remain conductive, so that the second stage is now in the "on" condition, while the first and third stages are in their "off" condition.

Similar action takes place upon the receipt of subsequent shift pulses at terminal 65 to successively establish the third stage in its "on" condition, with the first and second stages in their "off" condition, and to then re-establish the ring in its initial condition with the first stage in its "on" condition and the second and third stages in their "off" condition, as previously described.

It can be seen from the foregoing that an economical counter can readily be constructed in accordance with my invention, requiring only one electronic discharge device per stage, with an associated gas diode, such as an ordinary neon lamp, which not only serves as a switching device for the stage, but also provides an indication of the condition of the stage with which it is associated. Although only three stages are shown in Fig. 1, it will be obvious that the arrangement may be extended to have as many stages as desired. It is also apparent that suitable loads or output connections may be connected to any one or more of the stages for the operation of other devices.

Considering now the arrangement shown in Fig. 2, the gas diodes 17, 19, and 21 are connected in series with the cathodes of the associated triodes 11, 13, and 15, respectively. The anode of each triode is coupled to the grid of the triode in the succeeding stage by impedance couplings comprising capacitors 53, 57, and 61, and resistors 55, 59, and 63. Plate or anode load resistors 23, 25, and 27 connect the anodes of the triodes to the anode potential terminal 29. A suitable grid bias voltage is supplied from terminal 35 to the grid of each triode via grid bias resistors 33, 39, and 43.

The cathodes of each of the triodes are normally biased to a more positive voltage than the grids by a voltage dividing network extending from a suitable source connected to terminal 79, through a cathode biasing resistor, such as resistors 81, 83, and 85, to the cathodes of triodes 11, 13, and 15, through by-pass resistors 87, 89, and 91 connected across the gas diodes 17, 19, and 21, respectively, and thence through a common cathode resistor 93. The parts are selected and arranged so that the voltage normally present at the cathode with respect to ground lies between the ignition and sustaining voltage of the gas diodes. For example, the voltage at the cathodes may be of the order of +70 volts, and the bias voltage at terminal 35 may be of the order of +60 volts.

Considering the operation of a single stage of the counter, a positive pulse of sufficient amplitude on the grid of one of the triodes, say, for example, triode 11, will cause the triode to conduct. The accompanying rise in potential of the cahtode will cause the voltage across the gas diode to exceed its ignition voltage, e.g., 80 volts, so that the gas diode will conduct. This conduction lowers the cathode voltage with respect to ground to a point more negative than the normal grid bias, for example, to +55 volts, so that upon cessation of the positive pulse supplied to the grid of the triode, the triode and gas diode will remain conductive.

If, while the stage is in the conductive state, a positive shift pulse of sufficient magnitude is supplied to the shift input terminal 65, the voltage difference across the conductive gas diode will be reduced below the sustaining value of 60 volts and the gas diode will cease conducting. The cathode voltage of the associated triode is raised accordingly to its +70 volt value and conduction in the triode is cut off.

It can be seen from the foregoing that each stage of a counter constructed in accordance with the embodiment shown in Fig. 2 has two stable states, a first or "off" condition in which the triode and associated gas diode are non-conducting, and a second or "on" condition in which both the triode and gas diode are conducting. The "off" or "on" condition of any stage will be indicated by the absence or presence of a luminous discharge or ionization of the gas diode.

The operation of the interconnected stages forming the counter ring of Fig. 2 will now be described. Assuming that the first stage is in its "on" condition and the second and third stages are in their "off" condition, the supply of a shift pulse to shift input terminal 65 will reduce the voltage across the gas diode 17 below its sustaining voltage, so that the gas diode 17 and triode 11 are both rendered non-conductive. The cutoff of triode 11 causes a positive pulse to be supplied to the grid of triode 13, so that this tube conducts and raises the voltage across gas diode 19 to a value great enough to strike the discharge therein, notwithstanding the effect of the shift pulse applied simultaneously to the second stage. The parts are proportioned and arranged so that the positive-going shift pulse is shorter than the positive pulse supplied to the grid of triode 13 via capacitor 53 and resistor 55. The second stage, having been established in its "on" condition, will accordingly remain in this state after the cessation of the shift pulse. The third stage is unaffected, since the shift pulse serves to keep the gas diode 21 from conducting, and the pulse supplied to the grid of triode 15 when triode 13 conducts is ineffective to cause conduction of triode 15. Thus, the first stage has been placed in its "off" condition, the second stage has been placed in its "on" condition, and the third stage remains in its "off" condition, all as the result of the supply of a shift pulse to the ring.

In like manner, the next shift pulse will cause the second stage to be placed in its "on" condition, and the first stage to remain in its "off" condition. A third shift pulse will cause the counter to revert to its original condition, with the first stage in its "on" condition and the second and third stages in their "off" condition, so that the "count" is progressively advanced around the ring, one stage at a time.

The condition of the counter may be ascertained at any time by inspection of the gas diodes, the diode associated with a stage in its "on" condition providing a visible glow.

As pointed out in connection with Fig. 1, any or all stages may be provided with an output circuit for operating some type of load device, and the ring may be extended to have any number of stages.

It should be noted also that the arrangements shown in Figs. 1 and 2 may be modified to provide a line-type of counter rather than a re-entrant or ring-type of counter, if so desired.

While there have been shown and described and pointed out the fundamental novel features of the invention as applied to two preferred embodiments, it will be understood that various omissions and substitutions and changes in the form and details of the devices illustrated and in their operation may be made by those skilled in the art, without departing from the spirit of the invention. It is the intention, therefore, to be limited only as indicated by the scope of the following claims.

What is claimed is:

1. The combination comprising an electron discharge device having a conductive and a non-conductive condition determined by the relative value of potential existing between a first and a second element of said device, a glow discharge diode having predetermined values of ignition and sustaining voltages, means for supplying a bias potential to said glow discharge diode less than said ignition voltage and greater than said sustaining voltage, first input means for at times supplying an additional potential to said glow discharge diode to raise the potential across said diode to a value greater than said ignition voltage, and second input means for at other times supplying a potential to said glow discharge diode to lower the potential across said diode to a value less than said sustaining voltage, means coupling said first and second elements of said electron discharge device to said diode for governing the potential across said first and second elements of said electron discharge device whereby said electron discharge device is rendered conducting or non-conducting according as said diode is conducting or non-conducting.

2. In combination, an electron discharge device including at least an anode, a cathode and a control grid, a gaseous diode having a predetermined ignition voltage above which conduction occurs in the diode and a predetermined sustaining voltage below which conduction is cut off, an anode voltage source, means including an anode load resistor for connecting said anode and said cathode to the positive and negative terminals of said source of anode voltage, a negative bias voltage source for said electron discharge device, means for connecting said control grid to said negative bias voltage source to render said electron discharge device normally non-conductive, a bias voltage source for said diode, means for supplying said diode with a diode bias voltage from said bias voltage source, said diode bias voltage having a value greater than said sustaining voltage but less than said ignition voltage, means for increasing the voltage across said diode to a value greater than said ignition voltage, means for decreasing the voltage across said diode to a value less than said sustaining voltage, and means for supplying a voltage to said control grid effective to overcome said negative bias voltage when and only when said diode is conducting.

3. In combination, a glow discharge diode having predetermined ignition and sustaining voltages, a direct current power source for supplying a control voltage to said diode, said control voltage having a value greater than said sustaining voltage and less than said ignition voltage, means effective at times to increase said control voltage to a value greater than said ignition voltage, means effective at times to decrease said control voltage to a value less than said sustaining voltages, an electron discharge device including an anode, a cathode and a control grid, means for supplying potentials to said anode, cathode and control grid to normally maintain said electron discharge device in a non-conductive condition, and circuit means connecting said diode to said electron discharge device and effective when and only when said diode is conducting for rendering said electron discharge device conducting.

4. In combination, a glow discharge diode having predetermined ignition and sustaining voltages, a direct current power source for supplying a control voltage to said diode, said control voltage having a value greater than said sustaining voltage and less than said ignition voltage, a resistor connected between said diode and said source, an electron discharge device having a control grid, an anode and a cathode, means for supplying potentials to said anode, cathode and control grid to normally maintain said electron discharge device in a non-conductive condition, means connecting said control grid and said cathode across said resistor to render said electron discharge device conducting when and only when said diode is conducting, means for at times supplying an additive voltage to said control voltage to thereby increase the voltage across said diode to a value greater than said ignition voltage, and means for at times supplying a subtractive voltage to said control voltage to thereby decrease the voltage across said diode to a value less than said sustaining voltage.

5. In combination, a glow discharge diode having an anode and a cathode and having predetermined ignition and sustaining voltages, a diode bias potential terminal, an electron discharge device including an anode, a cathode and a control grid, an anode potential terminal, a negative bias potential terminal, a ground terminal, an anode resistor connected between the anode of said electron discharge device and said anode potential terminal, means for connecting the cathode of said electron discharge device to said ground terminal, means including a first and a second resistor connected in series for connecting said control grid to said negative bias potential terminal, means for connecting the cathode of said glow discharge diode to the junction of said first and second resistors, means including a third resistor for connecting the anode of said diode to said diode bias potential terminal, the parts being proportioned and arranged so that the voltage across said diode is normally less than said ignition voltage and greater than said sustaining voltage and so that said negative bias potential is normally effective to render said electron discharge device non-conductive, means connected to the anode of said diode for at times supplying an additive voltage sufficient to increase the voltage across said diode to a value greater than said ignition voltage and for at times supplying a subtractive voltage sufficient to decrease the voltage across said diode to a value less than said sustaining voltage, and an output circuit connected to the anode of said electron discharge device.

6. In combination, a glow discharge diode having an anode and a cathode and having predetermined ignition and sustaining voltages, a diode bias potential terminal, an electron discharge device including an anode, a cathode and a control grid, an anode potential terminal, a negative bias potential terminal, a ground terminal, an anode resistor connected between the anode of said electron discharge device and said anode potential terminal, means for connecting the cathode of said electron discharge device to said ground terminal, means including a first and a second resistor connected in series for connecting said control grid to said negative bias potential, means for connecting the cathode of said glow discharge diode to the junction of said first and second resistors, means including a third resistor for connecting the anode of said gaseous diode to said diode bias potential terminal, the parts being proportioned and arranged so that the voltage across said diode is normally less than said ignition voltage and greater than said sustaining voltage and so that said negative bias potential is normally effective to render said electron discharge device non-conductive, a first input circuit connected to the anode of said gaseous diode for supplying an additive voltage sufficient to increase the voltage across said diode to a value greater than said ignition voltage, a second input circuit connected to the anode of said gaseous diode for supplying a subtractive voltage sufficient to decrease the voltage across said diode to a value less than said sustaining voltage, and an output circuit connected to the anode of said electron discharge device.

7. In combination, a glow discharge diode having an anode and a cathode and having predetermined ignition and sustaining voltages, an electron discharge device including an anode, a cathode and a control grid, an anode potential terminal, a negative bias potential terminal, a ground terminal, and a diode bias potential; an anode resistor connected between the anode of said electron discharge device and said anode potential terminal, a cathode resistor connected between the cathode of said diode and said ground terminal, means for connecting the anode of said diode to the cathode of said electron discharge device, means for connecting the anode of said diode to said diode bias potential terminal, means for connecting the control grid of said electron discharge device to said negative bias potential terminal, the parts being proportioned and arranged so that said electron discharge device is normally non-conductive and the voltage across said diode is normally less than said ignition voltage and greater than said sustaining voltage, first input means connected to the control grid of said electron discharge device and effective at times to render said electron discharge device conductive, means responsive to the conduction of said electron discharge device for increasing the voltage across said diode to a value greater than said ignition voltage and second input means connected to said cathode resistor for at times decreasing the voltage across said diode to a value less than said sustaining voltage.

8. In combination, a glow discharge diode having an anode and a cathode and having predetermined ignition and sustaining voltages, an electron discharge device having an anode, a cathode and a control grid, an anode potential terminal, a negative bias potential terminal, a ground terminal and a diode bias potential terminal; an anode resistor connected between the anode of said electron discharge device and said anode potential terminal, a cathode resistor connected between the cathode of said diode and said ground terminal, the anode of said diode being connected to the cathode of said electron discharge device, a by-pass resistor connected between the anode and cathode of said diode, means including a first biasing resistor for connecting the junction of the anode of said diode and the cathode of said electron discharge device to said diode bias potential terminal, means including a second biasing resistor for connecting the control grid of said electron discharge device to said negative bias potential terminal, the parts being proportioned and arranged so that said electron discharge device is normally non-conductive and the voltage across said diode is normally less than said ignition voltage and greater than said sustaining voltage, first input means for at times supplying to the control grid of said electron discharge device a positive-going voltage pulse of magnitude sufficient to overcome the negative bias potential and thereby render said electron discharge device conductive and increase the voltage across said diode to a value greater than said ignition voltage, and second input means connected to the cathode of said diode for at times supplying a positive-going voltage pulse of magnitude sufficient to reduce the voltage across said diode to a value less than said sustaining voltage.

9. An electronic counter comprising a plurality of similar stages connected in cascade, each of said stages comprising an electron discharge device having at least an anode, a cathode and a control grid, a glow discharge diode having an anode and a cathode and having predetermined ignition and sustaining voltages; a diode bias potential terminal, an anode potential terminal, a negative bias potential terminal, a ground terminal, an anode resistor for each stage for connecting the anode of each of said electron discharge devices to said anode potential terminal, a common cathode resistor for connecting the cathode of each of said diodes to said ground terminal, the anode of each of said diodes being connected to the cathode of the associated electron discharge device, means including a first biasing resistor for each stage for connecting the anode of each of said diodes to said diode bias potential terminal, means including a second biasing resistor for each stage for connecting the control grid of each of said electron discharge devices to said negative bias potential terminal, a by-pass resistor for each stage for connecting the anode and the cathode of each of said diodes, the parts being proportioned and arranged so that the voltage across each of said diodes is normally less than said ignition voltage and greater than said sustaining voltage and so that said negative bias potential is normally effective to render each of said electron discharge devices non-conductive, circuit means for each of said stages for connecting the anode of the electron discharge device to the control grid of the electron discharge device in the next succeeding stage, and a shift input circuit connected to the cathode of each of said diodes for supplying thereto at times a voltage effective to decrease the voltage across said diodes to a value less than said sustaining voltage.

10. A re-entrant electronic counter comprising a plurality of stages including a first, a last and at least one intermediate stage, each of said stages comprising an electron discharge device having at least an anode, a cathode and a control grid, a glow discharge diode having an anode and a cathode and having predetermined ignition and sustaining voltages; a diode bias potential terminal, an anode potential terminal, a negative bias potential terminal, a ground terminal, an anode resistor for each stage for connecting the anode of each of said electron discharge devices to said anode potential terminal, a cathode resistor for connecting the cathode of each of said diodes to said ground terminal, the anode of each of said diodes being connected to the cathode of the associated electron discharge device, means including a first biasing resistor for each stage for connecting the anode of each of said diodes to said diode bias potential terminal, means including a second biasing resistor for each stage for connecting the control grid of each of said electron discharge devices to said negative bias potential terminal, a by-pass resistor for each stage for connecting the anode and the cathode of each of said diodes, the parts being proportioned and arranged so that the voltage across each of said diodes is normally less than said ignition voltage and greater than said sustaining voltage and so that said negative bias potential is normally effective to render each of said electron discharge devices non-conductive, circuit means for said first and said intermediate stages for connecting the anode of said electron discharge device associated with said first and said intermediate stages to the control grid of the electron discharge device in the next succeeding stage, circuit means for connecting the anode of the electron discharge device in said last stage to the control grid of the electron discharge device in said first stage, and a shift input circuit connected to the cathode of each of said diodes for supplying thereto at times a voltage effective to decrease the voltage across said diode to a value less than said sustaining voltage.

References Cited in the file of this patent

UNITED STATES PATENTS

| | | |
|---|---|---|
| 2,384,379 | Ingram | Sept. 4, 1945 |
| 2,399,473 | Desch et al. | Apr. 30, 1946 |
| 2,476,389 | Schmidt | July 19, 1949 |
| 2,549,779 | Crenshaw | Apr. 24, 1951 |
| 2,631,194 | Reeves | Mar. 10, 1953 |
| 2,676,756 | Gulley | Apr. 27, 1954 |
| 2,684,440 | Wallace et al. | July 20, 1954 |

OTHER REFERENCES

Proceedings of the National Electronics Conferences, vol. X, 1954, pages 626–635, "A Single Junction Transistor Bistable Flip Flop Circuit," by W. D. Rowe, page 629 relied on.